(12) United States Patent
Yano et al.

(10) Patent No.: US 11,417,499 B2
(45) Date of Patent: Aug. 16, 2022

(54) IMAGING DEVICE CAPTURING IMAGES OF A SAMPLE INCLUDING A PLURALITY OF SECTIONS

(71) Applicant: Hitachi High-Tech Corporation, Tokyo (JP)

(72) Inventors: Maasa Yano, Tokyo (JP); Hiroyuki Chiba, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/278,094

(22) PCT Filed: Dec. 18, 2018

(86) PCT No.: PCT/JP2018/046636
§ 371 (c)(1),
(2) Date: Mar. 19, 2021

(87) PCT Pub. No.: WO2020/129164
PCT Pub. Date: Jun. 25, 2020

(65) Prior Publication Data
US 2021/0351000 A1 Nov. 11, 2021

(51) Int. Cl.
*H01J 37/28* (2006.01)
*H01J 37/22* (2006.01)
*H01J 37/26* (2006.01)

(52) U.S. Cl.
CPC ............ *H01J 37/28* (2013.01); *H01J 37/222* (2013.01); *H01J 37/261* (2013.01); *H01J 2237/2801* (2013.01); *H01J 2237/2806* (2013.01)

(58) Field of Classification Search
CPC .. H01J 37/00; H01J 37/02; H01J 37/26; H01J 37/28; H01J 37/22; H01J 37/261; H01J 37/222; H01J 2237/2801; H01J 2237/2806
(Continued)

(56) References Cited

U.S. PATENT DOCUMENTS 5,917,469 A 6/1999 Matsushita
2005/0263702 A1* 12/2005 Agemura ................ H01J 37/28
250/310

(Continued)

FOREIGN PATENT DOCUMENTS

JP 5-298417 A 11/1993
JP 2009-277536 A 11/2009
JP 2011-76960 A 4/2011

OTHER PUBLICATIONS

International Search Report (PCT/ISA/210) issued in PCT Application No. PCT/JP2018/046636 dated Feb. 26, 2019 with English translation (four (4) pages).
(Continued)

*Primary Examiner* — Jason L McCormack
(74) *Attorney, Agent, or Firm* — Crowell & Moring LLP

(57) ABSTRACT

An object of the invention is to accurately correct a deviation in position or angle between observation regions in an imaging device that acquires images of a plurality of sample sections. The imaging device according to the invention identifies a correspondence relationship between the observation regions between the sample sections using a feature point on a first image, corrects a deviation between the sample sections using a second image in a narrower range than the first image, and after reflecting a correction result, acquires a third image having a higher resolution than the second image (see FIG. 6B).

14 Claims, 14 Drawing Sheets

(58) Field of Classification Search
USPC .............................. 250/306, 307, 311, 492.3
See application file for complete search history.

(56) References Cited

U.S. PATENT DOCUMENTS

2009/0283677 A1    11/2009   Ikku
2012/0057015 A1*   3/2012    Ward ...................... H01J 37/28
                                                                   348/80
2017/0092460 A1*   3/2017    Kiyohara ................ H01J 37/20

OTHER PUBLICATIONS

Japanese-language Written Opinion (PCT/ISA/237) issued in PCT Application No. PCT/JP2018/046636 dated Feb. 26, 2019 (three (3) pages).

\* cited by examiner

IMAGING DEVICE CAPTURING IMAGES OF A SAMPLE INCLUDING A PLURALITY OF SECTIONS

TECHNICAL FIELD

The present invention relates to an imaging device that captures an image of a sample including a plurality of sections.

BACKGROUND ART

There is a technique for superimposing images of a plurality of tissue sections. PTL 1 discloses a method of obtaining an image for which position alignment is performed by an image position alignment device. PTL 1 discloses a technique for performing position alignment by using a radiation image of a stimulable phosphor sheet of a rat brain section, selecting two images for which the position alignment is performed, extracting an outline of the brain section, and extracting relatively prominent points as characteristic points.

CITATION LIST

Patent Literature

PTL 1: JP-A-H5-298417

SUMMARY OF INVENTION

Technical Problem

When the same portion of each continuous section is observed, ultrathin sections are placed on a hard substrate and observed. At this time, the position and angle of each section may be deviated. As a method of correcting the deviations, for example, a method of correcting the deviations of the position or a rotation angle by comparing the sections using an image (hereinafter, referred to as a low magnification image) captured at a magnification including all sections is considered. The size of the section is, for example, in an order of millimeters for a biological tissue sample. However, the region to be finally observed is significantly smaller than a size of an entire sample, and for example, if the entire sample is in the order of millimeters, an observation target region is in an order of micrometers or in an order of nanometers. In this case, even if the position alignment is performed based on the image including the entire sample, when the sections are compared with each other in an size order of the observation target region, a large position deviation may occur due to a magnification difference.

The invention has been made in view of the above problems, and an object of the invention is to accurately correct a deviation in position or angle between observation regions in an imaging device that acquires images of a plurality of sample sections.

Solution to Problem

The imaging device according to the invention identifies a correspondence relationship between the observation regions between the sample sections using a feature point on a first image, corrects a deviation between the sample sections using a second image in a narrower range than the first image, and after reflecting a correction result, acquires a third image having a higher resolution than the second image.

Advantageous Effect

According to the imaging device in the invention, after the first image is used to perform position alignment on the observation regions between the sample sections, the second image in a narrower range is used to further correct the deviation between the observation regions. Therefore, the deviation in the third image having a higher resolution can be effectively prevented. That is, the position alignment of the observation target region can be performed with high accuracy by simple processing that does not require complicated processing such as coordinate conversion.

DESCRIPTION OF EMBODIMENTS

Figure 1:
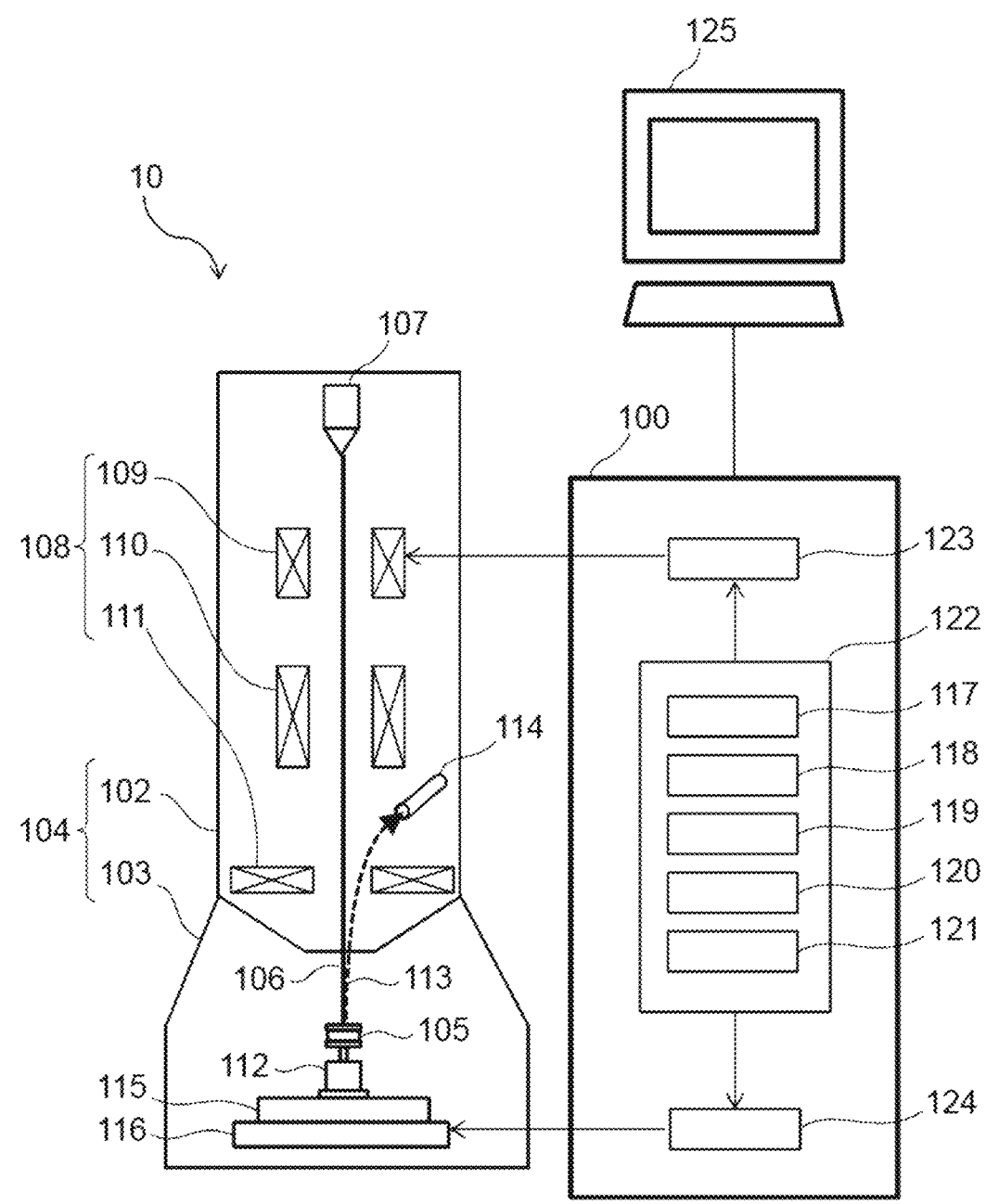
FIG. 1 is a configuration diagram showing a charged particle beam device 10 according to a first embodiment.

In the following embodiments, description may be divided into a plurality of sections or embodiments if necessary for convenience. Unless particularly specified, the sections or embodiments are not independent of each other, but have a relationship in which one section or embodiment is a modification, detailed description, supplementary description, or the like of a part or all of another section or embodiment. In all drawings showing the following embodiments, those having the same function are denoted by the same reference numerals in principle, and repeated description thereof will be omitted. Hereinafter, embodiments of the invention will be described in detail with reference to the drawings.

First Embodiment

FIG. 1 is a configuration diagram of a charged particle beam device 10 according to a first embodiment of the invention. The charged particle beam device 10 can be a scanning electron microscope (imaging device) that captures an observation image of a sample. The charged particle beam device 10 includes a device main body 104 and a controller 100. The device main body 104 is formed such that a lens barrel 102 and a sample chamber 103 are integrated. The device main body 104 operates as an imaging unit that captures an image of the continuous section sample 105. The controller 100 includes a position calculation unit 122, an optical system control unit 123, a stage control unit 124, and the display device 125.

The lens barrel 102 includes an electron gun 107 and an electron optical system 108. The electron gun 107 emits an electron beam 106. The electron optical system 108 controls a trajectory of the electron beam 106. The electron optical system 108 includes a condenser lens 109, a deflector 110, and an objective lens 111. The condenser lens 109 converges the electron beam 106 emitted from the electron gun 107. The deflector 110 performs scanning with the electron beam 106. The objective lens 111 converges the electron beam 106 such that the electron beam 106 is focused on a surface of the continuous section sample 105.

By emitting the electron beam 106 to the continuous section sample 105, a signal 113 (for example, a secondary electron or a reflected electron) is generated. A detector 114 is disposed at an appropriate position in the lens barrel 102 or the sample chamber 103, and detects the signal 113.

The sample chamber 103 has a structure in which a sample table 112 is housed via a leading-in and leading-out port (not shown) that can be opened and closed. The continuous section sample 105 is placed on the sample table 112. The sample chamber 103 further includes a sample stage 115 on which the sample table 112 is placed.

The sample stage 115 includes a stage control device 116. The stage control device 116 moves or rotates the continuous section sample 105 in, for example, a horizontal plane and a direction perpendicular to the plane in the sample chamber 103, thereby displacing a position and an orientation of the continuous section sample 105 in the sample chamber 103. The stage control unit 124 controls the stage control device 116, and the optical system control unit 123 controls the electron optical system 108. The charged particle beam device 10 emits the electron beam 106 to any position of the continuous section sample 105 and detects the generated signal 113 by the detector 114, so that any position of the continuous section sample 105 can be observed at any magnification.

An image acquisition unit 117 converts the signal 113 detected by the detector 114 into observation image data. The position calculation unit 122 is an information processing device such as a computer. The position calculation unit 122 includes an image acquisition unit 117, an instruction input unit 118, a position storage unit 119, an image processing unit 120, and a correction image generation unit 121. The position calculation unit 122 performs a calculation described later using information received from the instruction input unit 118 and information stored in the position storage unit 119. The stage control unit 124 and the optical system control unit 123 respectively control the stage control device 116 and the electron optical system 108 using a calculation result of the position calculation unit 122.

The display device 125 is, for example, a screen display device such as a display device, and displays an observation image of the continuous section sample 105 acquired by the image acquisition unit 117 on a screen. The display device 125 also displays a screen interface described later with reference to FIG. 3B and the subsequent drawings. The instruction input unit 118 receives a specified input which is input on the screen interface.

Figure 2:
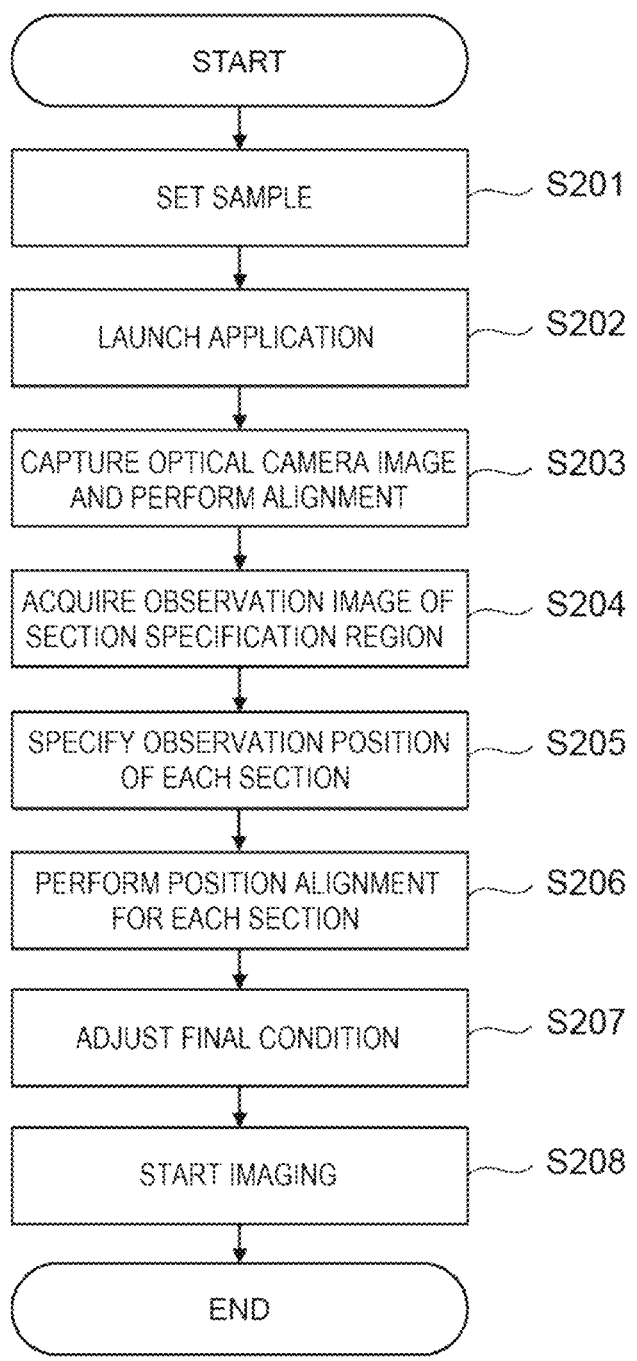
FIG. 2 is a flowchart showing a procedure of imaging a continuous section sample 105 by the charged particle beam device 10.

FIG. 2 is a flowchart showing a procedure of imaging the continuous section sample 105 by the charged particle beam device 10. Hereinafter, each step in FIG. 2 will be described.

(FIG. 2: Steps S201 and S202)

A user places the continuous section sample 105 on the sample table 112, and places the sample table 112 on the sample stage 115 (S201). The user launches an application on the display device 125 (S202). The application is used by the user to input an instruction to the charged particle beam device 10, and provides a screen interface described later on the display device 125. For example, when the user specifies a storage destination of a captured image on the display device 125, the display device 125 communicates with the charged particle beam device 10 to start the application.

(FIG. 2: Step S203)

The user captures an optical camera image of the entire continuous section sample 105. The user causes the controller 100 to capture the captured optical camera image. The controller 100 captures the acquired camera image on an entire region display unit 501 of the screen interface described later. Accordingly, it is easier for the user to grasp an approximate position of the section on the substrate. The controller 100 calibrates an observation coordinate system and a magnification between the optical camera image and the charged particle beam device 10.

(FIG. 2: Step S203: Supplement)

The optical camera image in the present step is for performing position alignment to an extent that the observation image of the sample piece to be observed can be acquired by the electron optical system 108 in a step before the position alignment is performed on the continuous section sample 105. For example, even if the observation image of the sample stage 115 is acquired, it does not make sense for the position alignment. Therefore, it is meaningful to perform the position alignment at least to an extent that the observation image of the sample piece can be acquired. If a similar procedure can be performed using the observation image acquired by the electron optical system 108, the observation image may be used instead of an optical camera image.

(FIG. 2: Step S204)

The user specifies an entire region (section specification region 305 in FIG. 3B) including a section to be observed from the optical camera image captured in step S203 via the screen interface described later. The controller 100 acquires a region (low magnification region 306 in FIG. 3C) imaged by the charged particle beam device 10 at a magnification at which at least a part of an outer shape of each section can be recognized. When the size of the low magnification region 306 is less than the size of the section specification region 305, the controller 100 acquires the observation image of the entire section specification region 305 by combining the images of the low magnification region 306. The controller 100 associates a coordinate system of the observation image with a coordinate system of the sample stage 115.

(FIG. 2: Step S205)

The user specifies the coordinates of a first feature point and the coordinates of a first observation region on an image of a first sample section, and specifies the coordinates of a second feature point on an image of a second sample section. It is considered that an arrangement relationship between the first feature point and the first observation region is substantially the same as that on the second sample section. Therefore, the controller 100 can calculate the coordinates of the region (second observation region) corresponding to the first observation region on the second sample section according to an arrangement relationship among the first feature point, the first observation region and the second feature point. For a third sample section, the coordinates of a third observation region corresponding to the second observation region can be calculated according to an arrangement relationship between the second feature point and the second observation region. The same applies below. The details of the present step will be described again with reference to FIG. 3D described later.

(FIG. 2: Step S205: Supplement)

The first observation region can be specified as a partial region of the observation image of the first sample section. That is, the image (second image) of the first observation region is an image having a narrower range than the observation image (first image) of the entire first sample section. The same applies to the second observation region and subsequent regions. Hereinafter, for convenience, an observation region may be referred to as a medium magnification region.

(FIG. 2: Step S206)

The controller 100 images a region in which each section is set at a medium magnification. The image processing unit 120 calculates a position deviation including a rotation of each medium magnification image, the corrected image generation unit 121 corrects a rotation deviation of each medium magnification image, and the position calculation unit 122 corrects the position deviation in a horizontal direction of the image of which the rotational deviation is corrected. The details of the present step will be described later with reference to FIG. 5 and FIGS. 6A to 6D.

(FIG. 2: Steps S207 and S208)

The controller 100 adjusts imaging conditions such as a final acceleration voltage, a current amount, and a working distance (S207), and starts imaging (imaging of a high magnification image) for observing the continuous section sample 105 (S208). In step S208, a high magnification image is acquired after the rotation deviation and the position deviation that are calculated in FIG. 4 described later are reflected.

Figure 3A:
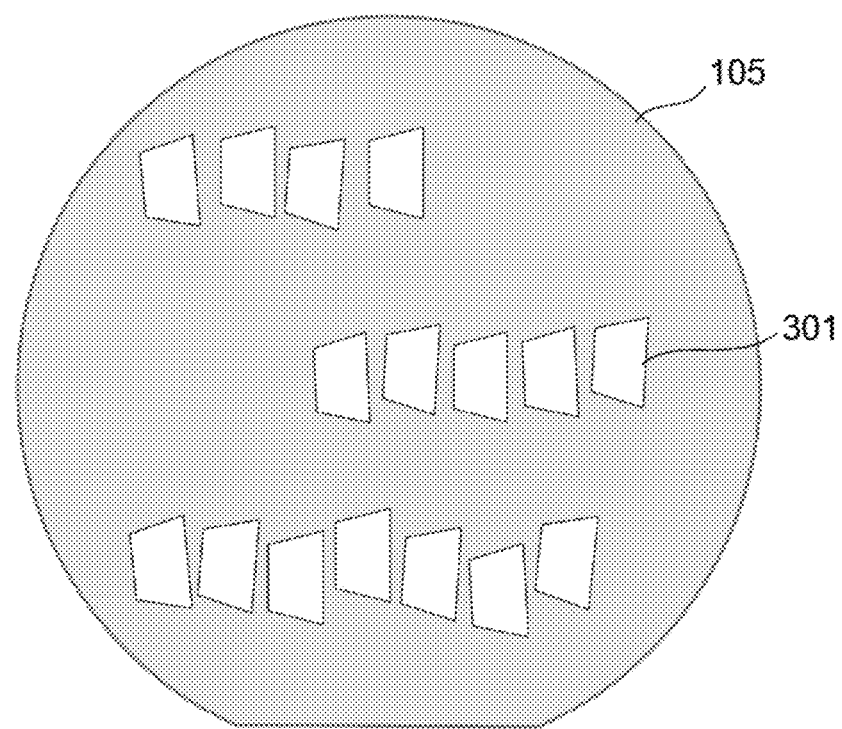
FIG. 3A shows an example of the continuous section sample 105 and an observation region.
Figure 3A:
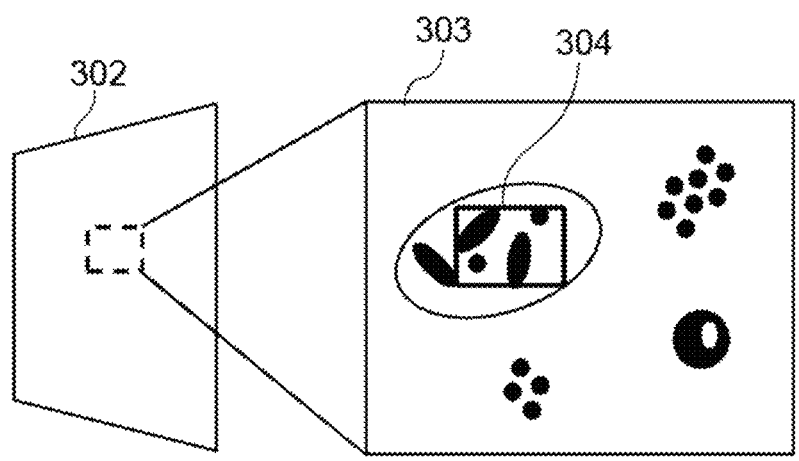

FIG. 3A is an example of the continuous section sample 105 and the observation region. The continuous section sample 105 is a sample in which a plurality of sections 301 are continuously arranged. It is assumed that the sections have substantially the same shape. An upper part of FIG. 3A shows an example of the optical camera image acquired in step S203. A lower part of FIG. 3A shows an example of each observation region.

An entire region 302 is a region that includes one entire section. The medium magnification region 303 is a region specified as an observation region in step S205, and corresponds to a partial region of the entire region 302. The medium magnification region 303 can be used to correct the angle and position of each section in step S206, and can also be used to search a visual field when the user specifies the high magnification region 304. The high magnification region 304 is a region that the user finally intends to observe. A resolution of the image in the high magnification region 304 is higher than a resolution of the image in the medium magnification region 303.

Figure 3B:
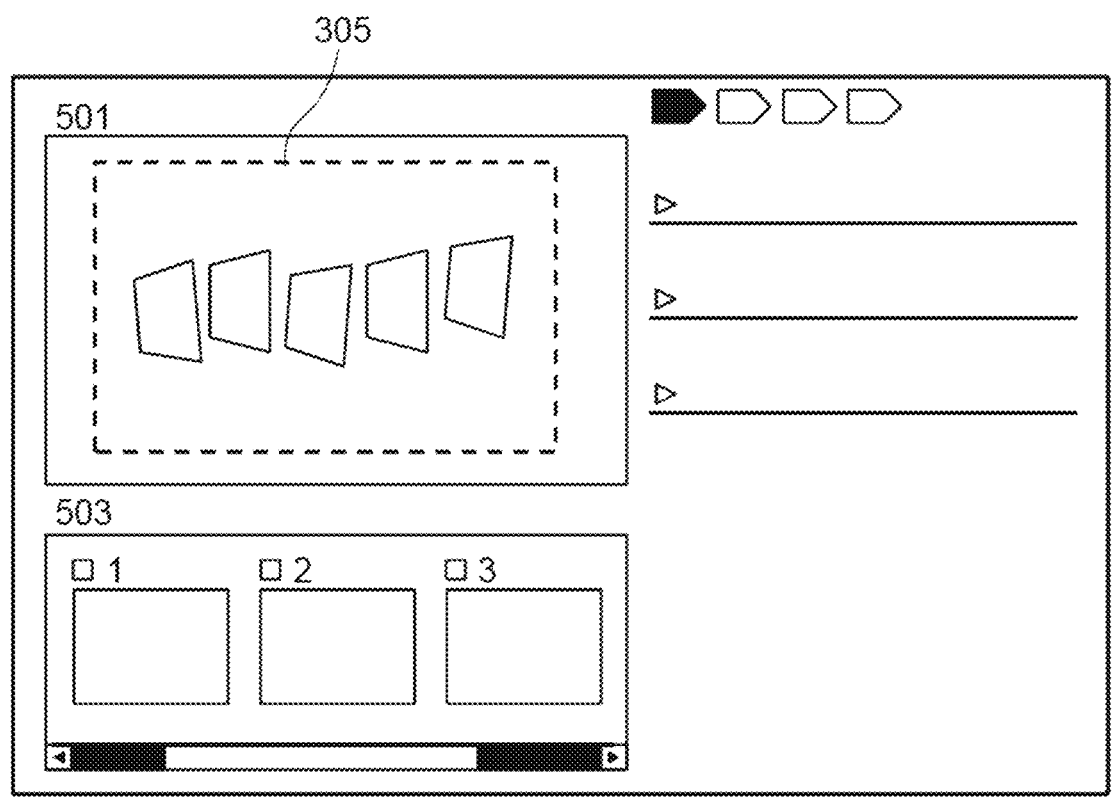
FIG. 3B is a diagram showing a state in which the user specifies a section specification region 305 in step S204.

FIG. 3B is a diagram showing a state in which the user specifies the section specification region 305 in step S204. As the section specification region 305, the user can specify a range including the section to be observed in the optical camera image, for example, by an operation of dragging a mouse.

Figure 3C:
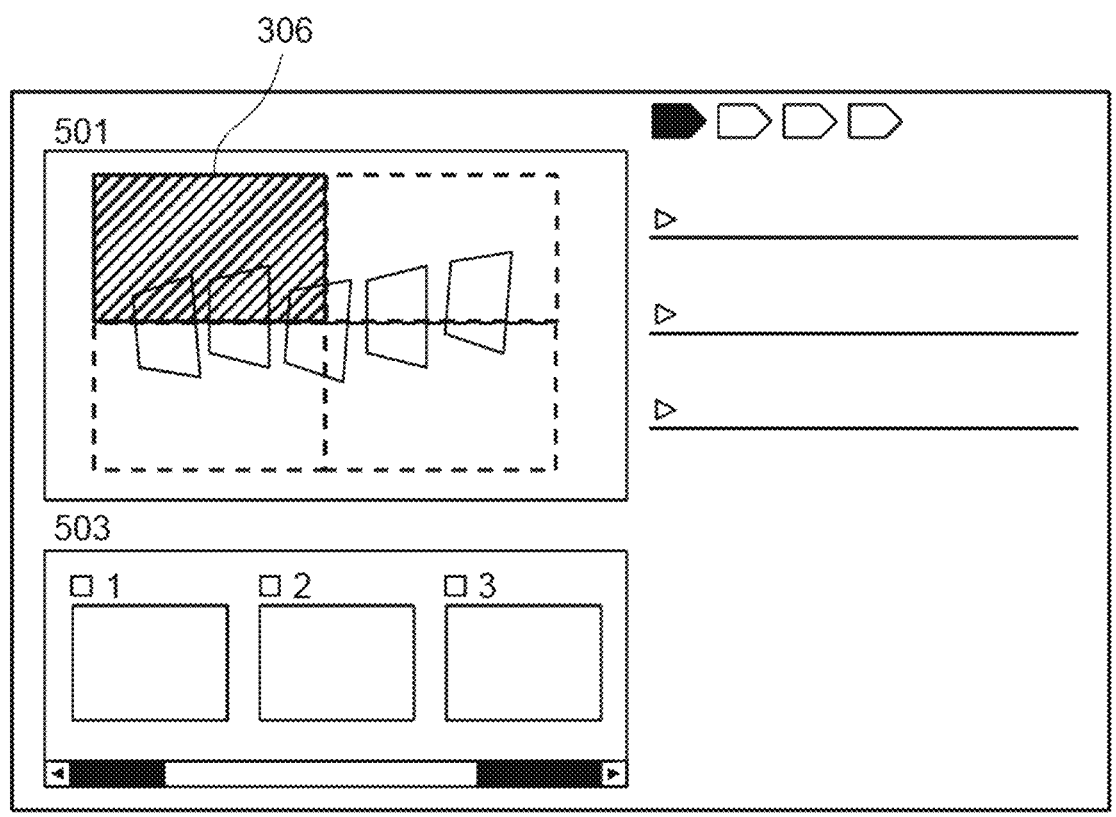
FIG. 3C is a diagram showing a state in which a controller 100 generates an observation image of the entire section specification region 305 by pasting together images of a low magnification region 306 in step S204.

FIG. 3C is a diagram showing a state in which the controller 100 generates an observation image of the entire section specification region 305 by pasting together images of the low magnification region 306 in step S204.

Figure 3D:
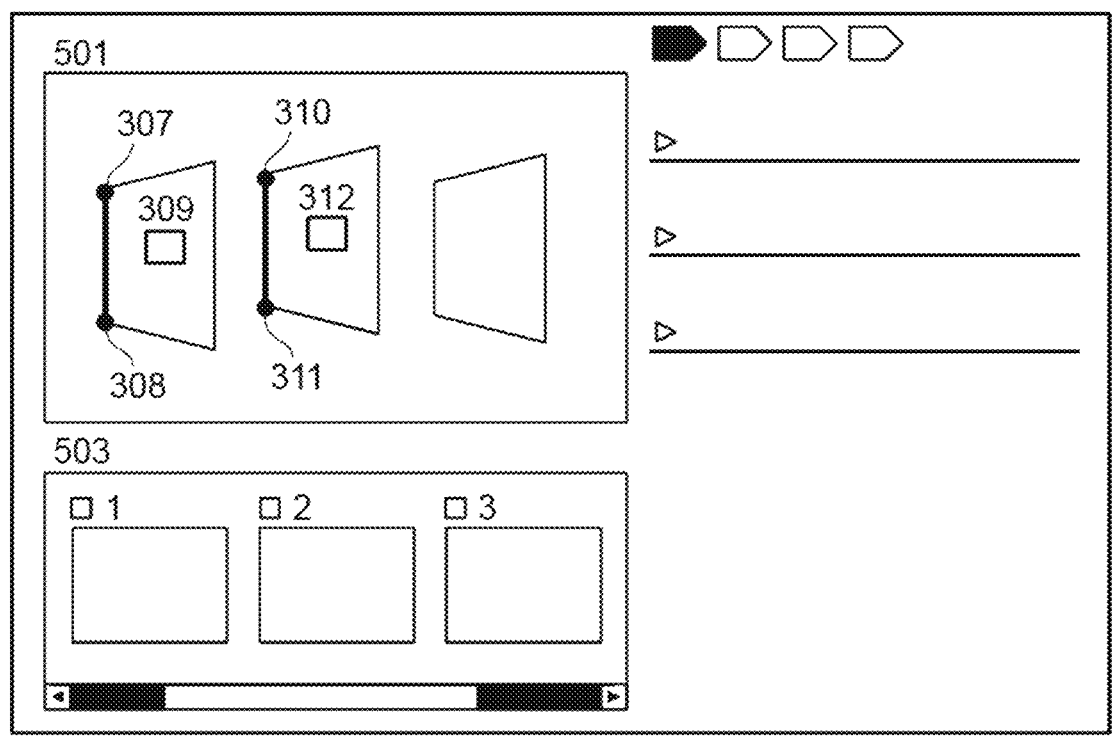
FIG. 3D is a diagram showing a state in which position alignment of an inspection region is performed between the sample sections in step S205.

FIG. 3D is a diagram showing a state in which position alignment of an inspection region is performed between the sample sections in step S205. On the entire region 302 of the first sample section, the user specifies the coordinates of the first feature points (for example, end portions 307 and 308 of the first sample section), and specifies the coordinates of the first observation region 309. The user further specifies second feature points (end portions 310 and 311 of the second sample section) corresponding to the first feature point on the entire region 302 of the second sample section. Each coordinate can be input by, for example, clicking a coordinate point on the screen with the mouse, or dragging the mouse.

The arrangement relationship between the first feature point and the first observation region (that is, the relative coordinates between the first feature point and the first observation region) is considered to be substantially the same as that between the second feature point and the second observation region. By using the relationship, the controller 100 calculates the coordinates of the second observation region 312 according to the arrangement relationship among the first feature point, the first observation region and the second feature point. Accordingly, the coordinates of the observation region corresponding to the first observation region can be calculated accurately and semi-automatically. For the third sample section, the third observation region corresponding to the second observation region is identified according to an arrangement relationship among the second feature point, the second observation region and a third feature point on the third sample section. The same applies below.

Figure 4:
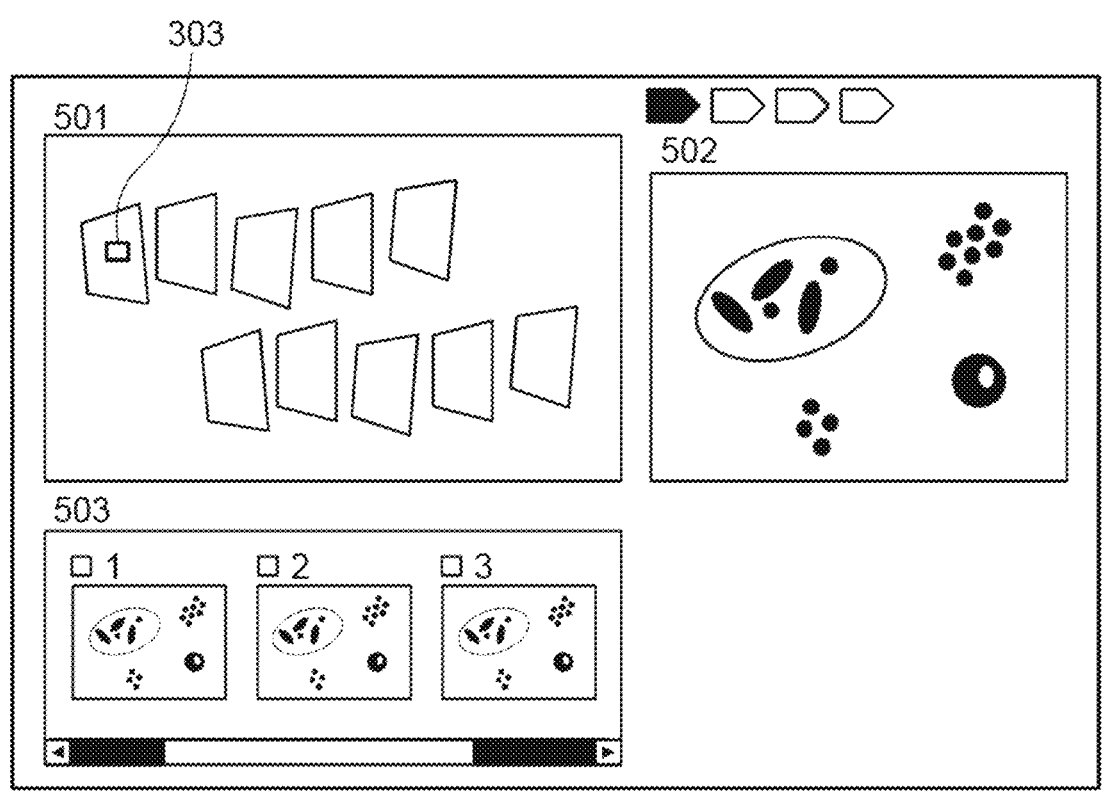
FIG. 4 shows an example of a screen interface displayed by a display device 125.

FIG. 4 shows an example of a screen interface displayed by the display device 125. The user uses the screen interface to perform operations in each step in the flowchart in FIG. 2. The screen interface includes the entire region display unit 501, a medium magnification region display unit 502, and a captured image display unit 503.

The entire region display unit 501 displays the image of the entire region 302. The entire region display unit 501 displays a plurality of sample sections provided in the continuous section sample 105. The medium magnification region display unit 502 displays an image of the medium magnification region 303. The captured image display unit 503 displays a medium magnification image and a high magnification image of each imaged section. By numbering each section, an order in which the images are captured or the number of the sections can be instantly grasped.

Figure 5:
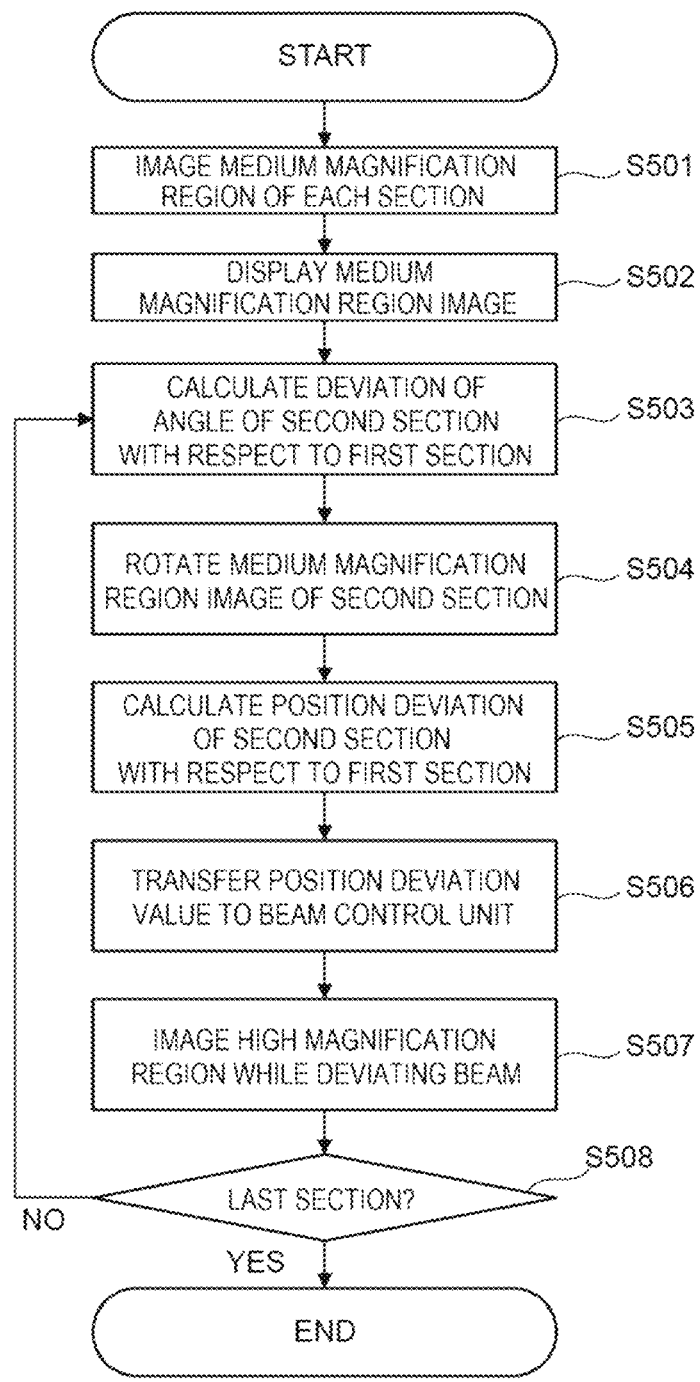
FIG. 5 is a flowchart showing details of step S206.

FIG. 5 is a flowchart showing details of step S206. Hereinafter, each step in FIG. 5 will be described.

(FIG. 5: Step S501)

The image acquisition unit 117 acquires an image of the medium magnification region 303 of the observation region in all sections. The coordinates of the observation region in each section can be calculated in step S205.

(FIG. 5: Step S502)

The image acquisition unit 117 displays a medium magnification region image 601 of the first sample section and the medium magnification region image 602 of the second sample section on the medium magnification region display unit 502. A screen display example of the present step will be described later with reference to FIG. 6A.

(FIG. 5: Steps S503 to S504)

The image processing unit 120 superimposes the medium magnification region image 601 of the first sample section and the medium magnification region image 602 of the second sample section, and calculates a deviation of an angle of the second section when the first section is used as a reference (S503). The correction image generation unit 121 corrects the deviation of the rotation angle by rotating the medium magnification region image 602 of the second section (S504). In the third sample section, the image processing unit 120 superimposes the medium magnification region image 602 of the second sample section and the medium magnification region image 603 of the third sample section, and calculates a deviation of an angle of the third section when the second sample section is used as a reference. The correction image generation unit 121 corrects the deviation of the rotation angle by rotating the medium magnification region image 603 of the third sample section. Similar correction applies to a fourth sample section and subsequent sections. An example of the present step will be described later with reference to FIG. 6B.

(FIG. 5: Step S505)

The display device 125 displays, on the medium magnification region display unit 502, an image of the medium magnification region 303 whose rotation angle is corrected. The position calculation unit 122 obtains the coordinates of the medium magnification region image 601 of the first sample section and the coordinates of the rotated medium magnification region image 602 of the second sample section. The position calculation unit 122 calculates the deviation of the second sample section in the XY direction when the first sample section is used as a reference. For the third sample section, the position calculation unit 122 calculates the deviation of the third sample section in the XY direction when the second sample section is used as a reference. The same applies to the fourth sample section and subsequent sections. An example of the present step will be described later with reference to FIG. 6C.

(FIG. 5: Step S505: Supplement)

Depending on a structure of the sample, a shape pattern may differ significantly between the first section and the subsequent section, as exemplified in FIG. 9A described later. Therefore, it is considered that the position alignment of the medium magnification region 303 is most desirable to be performed between adjacent sections. The above is why the position alignment of the third sample section is performed using the second sample section as a reference. The same applies to the fourth sample section and subsequent sections.

(FIG. 5: Steps S506 and S507)

The instruction input unit 118 transfers a deviation amount calculated in step S505 to the optical system control unit 123 (S506). The optical system control unit 123 corrects the position deviation between the medium magnification region images 601 and 602 by applying the received deviation amount to a deflection amount obtained by the deflector 110, and acquires an image (third image) of the high magnification region 304 after the correction is reflected (S507). Accordingly, a high magnification image after the deviation of the observation region between the sample sections is corrected can be obtained.

(FIG. 5: Step S507: Supplement 1)

The position deviation between the medium magnification region images 601 and 602 can be corrected by the sample stage 115 if operation accuracy of the sample stage 115 is sufficient. In this case, the instruction input unit 118 transfers the deviation amount calculated in step S505 to the stage control device 116, and the stage control device 116 reflects the deviation amount to the position control of the sample stage 115. Accordingly, similar to the case of using the deflector 110, a high magnification image after the deviation of the observation region between the sample sections is corrected can be obtained.

(FIG. 5: Step S507: Supplement 2)

The controller 100 corrects the rotation deviation between the medium magnification region images 601 and 602 by rotating, using any one of the medium magnification region images 601 and 602 as a reference, another image according to image processing. Therefore, in the present step, it is not always necessary to correct the rotation deviation by the electron optical system 108. When the rotation deviation is corrected without using the image processing, a direction in which scanning is performed with the electron beam 106 may be rotated.

(FIG. 5: Step S507: Supplement 3)

The display device 125 presents the high magnification image acquired in the present step to the user by displaying the high magnification image on the screen. By visually checking the high magnification image, the user can check whether the position alignment of the high magnification image is properly performed between the sample sections. If the user does not visually check the high magnification image, the present step may be omitted.

Figure 6A:
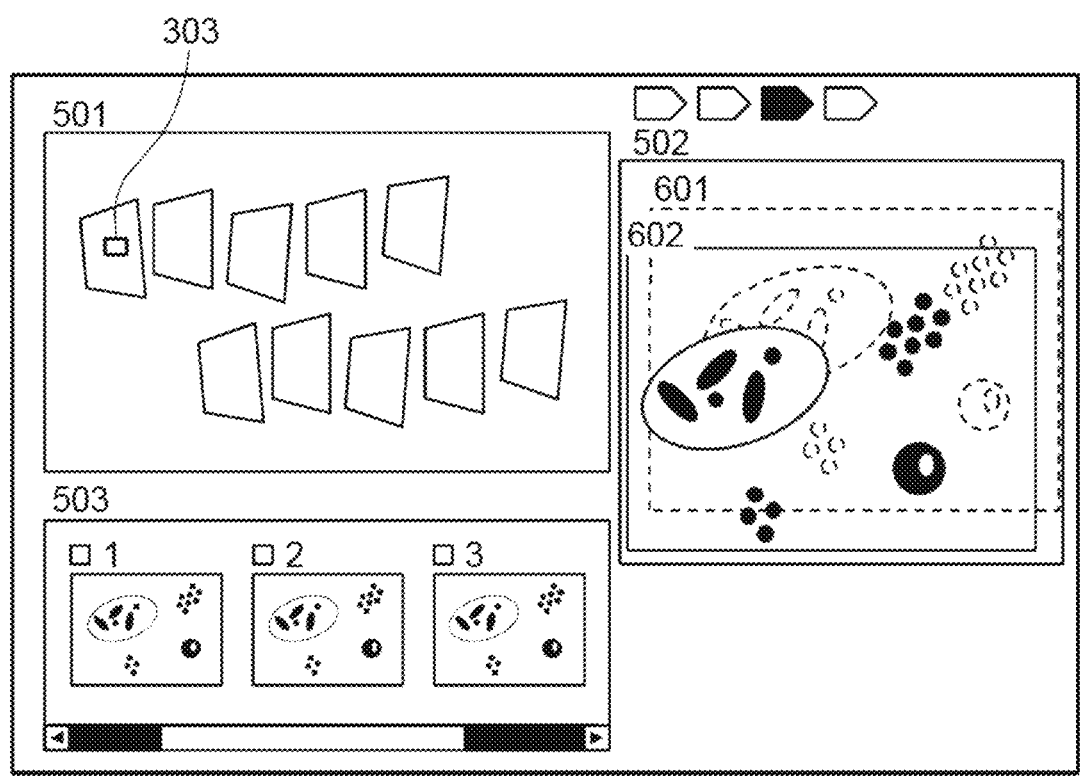
FIG. 6A is an example of a screen displayed by the screen interface in step S502.

FIG. 6A is an example of a screen displayed by a screen interface in step S502. The display device 125 displays an image of the medium magnification region 303 used for the position alignment on the medium magnification region display unit 502. For example, when aligning positions of the first sample section and the second sample section, the display device 125 superimposes the medium magnification region image 601 of the first sample section and the medium magnification region image 602 of the second sample section on the medium magnification region display unit 502.

Figure 6B:
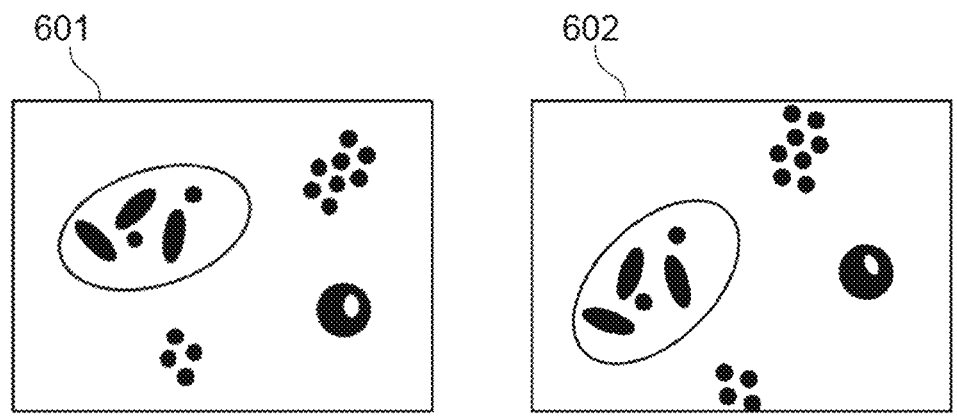
FIG. 6B shows an example of a method of correcting a rotation angle using an image of a medium magnification region 303 displayed on a medium magnification region display unit 502.
Figure 6B:
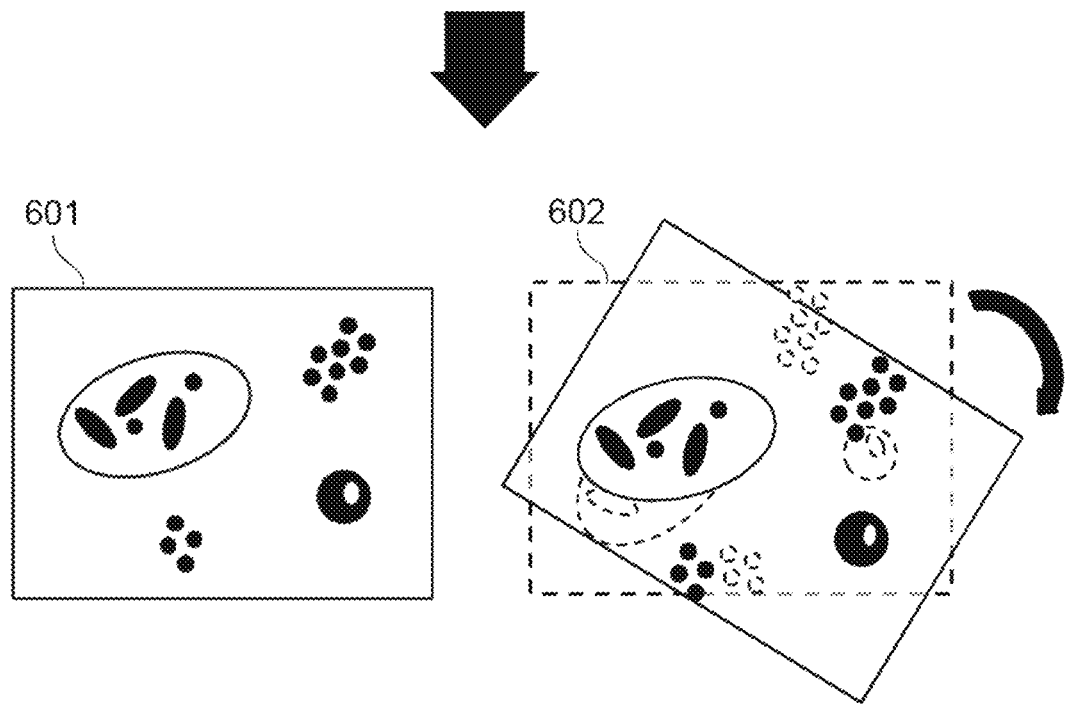

FIG. 6B shows an example of a method of correcting the rotation angle using the image of the medium magnification region 303 displayed on the medium magnification region display unit 502. The image processing unit 120 superimposes the medium magnification region image 601 of the first sample section and the medium magnification region image 602 of the second sample section, and calculates a deviation of an angle of the second section when the first section is used as a reference. The correction image generation unit 121 corrects the deviation of the rotation angle by rotating the medium magnification region image 602 of the second section.

Figure 6C:
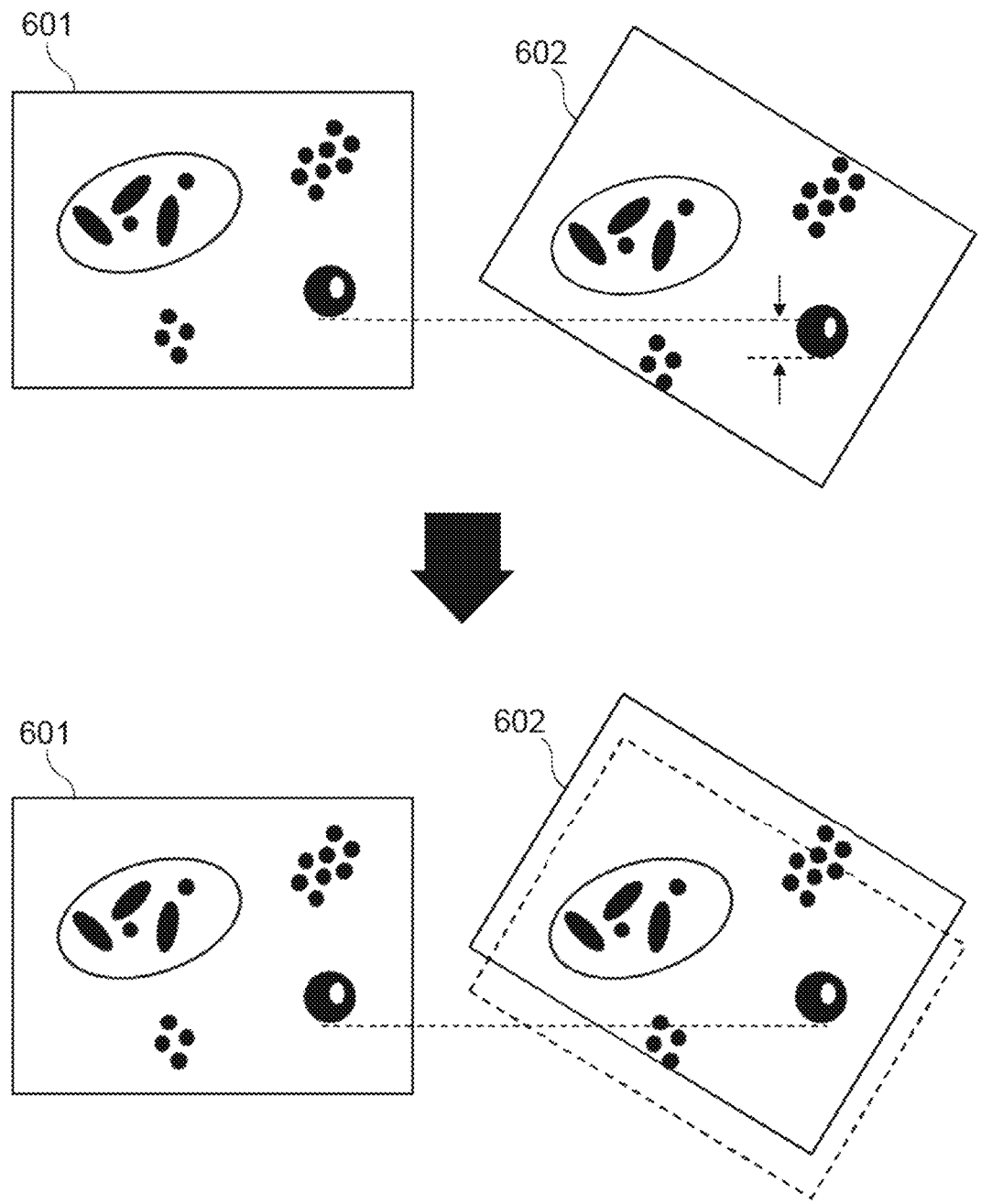
FIG. 6C shows an example of a method of correcting a position in an XY direction using the image of the medium magnification region 303 displayed on the medium magnification region display unit 502.

FIG. 6C shows an example of a method of correcting a position in the XY direction using the image of the medium magnification region 303 displayed on the medium magnification region display unit 502. The position calculation unit 122 obtains the coordinates of the medium magnification region image 601 of the first sample section and the coordinates of the rotated medium magnification region image 602 of the second sample section. The position calculation unit 122 calculates the deviation of the second section in the XY direction when the first section is used as a reference. The instruction input unit 118 transfers the calculated deviation amount to the optical system control unit 123.

First Embodiment: Summary

The charged particle beam device 10 according to the first embodiment performs the position alignment of the observation region using the image of the entire region 302, and then corrects the rotation deviation and the position deviation between the observation regions using the image of the medium magnification region 303. The charged particle beam device 10 acquires an image of the high magnification region 304 after reflecting the correction of the rotation deviation and the position deviation between the medium magnification regions 303. Accordingly, even if the deviation between the observation regions remains after the position alignment is performed between the entire regions 302, the position alignment between the high magnification regions 304 can be performed by correcting the deviation. Therefore, for example, if the entire sample is in the order of millimeters, the position alignment can be accurately performed between the observation regions in the order of micrometers or nanometers.

The charged particle beam device 10 according to the first embodiment specifies the first feature points (307 and 308) and specifies the first observation region 309 on the entire region 302 of the first sample section, and further specifies the second feature points (310 and 311) on the entire region 302 of the second sample section, thereby calculating the coordinates of the second observation region 312. Accordingly, the position alignment between the observation regions can be performed semi-automatically and accurately. By performing the position alignment between the entire regions 302 in advance, correction accuracy of the rotation deviation and the position deviation between the medium magnification regions 303 can be improved. Since the user only needs to specify the first feature point, the first observation region and the second feature point, a work load on the user can be reduced.

Second Embodiment

Figure 7:
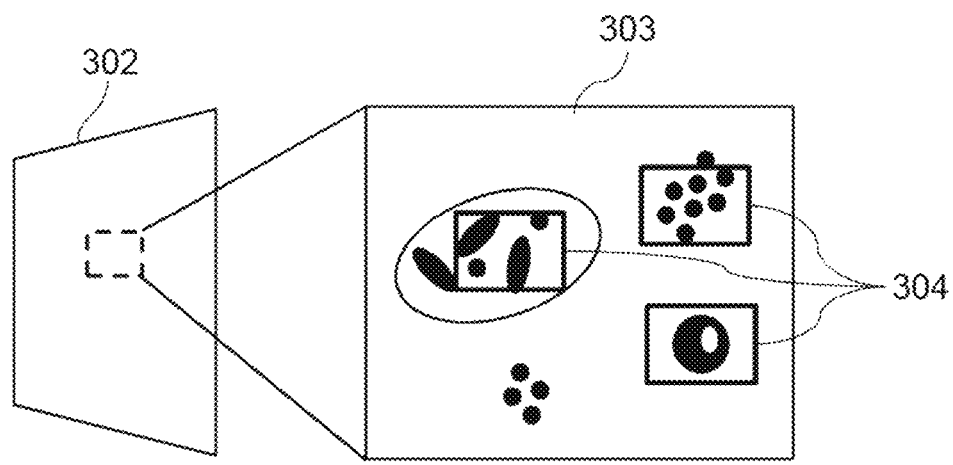
FIG. 7 is a diagram showing an example in which a plurality of high magnification regions 304 are specified from an inside of the medium magnification region 303.

FIG. 7 is a diagram showing an example in which a plurality of high magnification regions 304 are specified from an inside of the medium magnification region 303. The user can specify the plurality of high magnification regions 304 on the medium magnification region display unit 502. In this case, since a plurality of regions desired to be imaged can be specified using one image of the medium magnification region 303, a throughput of the imaging work can be expected to be improved.

Third Embodiment

Figure 8:
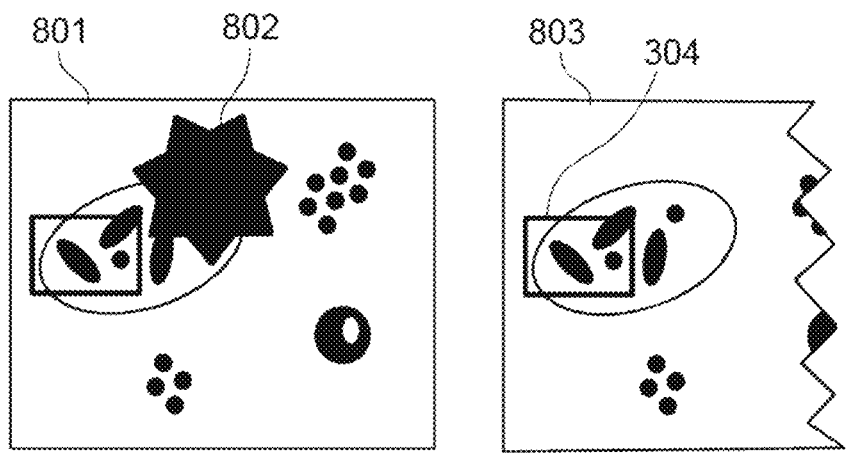
FIG. 8 is a diagram showing an example of selecting a sample section, from which a high magnification image is acquired, using an image of the medium magnification region 303.

FIG. 8 is a diagram showing an example of selecting a sample section, from which a high magnification image is acquired, using an image of the medium magnification region 303. The continuous section may include a section 801 to which dust 802 is attached, a broken section 803, or the like. The controller 100 displays an image of the medium magnification region 303 on the medium magnification region display unit 502, and the user specifies a failed section such as the section 801 or 803 on the screen while viewing the image. The controller 100 captures a high magnification image by excluding the failed section specified by the user. Accordingly, the error of the correction using the medium magnification region 303 can be prevented, and the throughput can be improved.

Fourth Embodiment

Figure 9A:
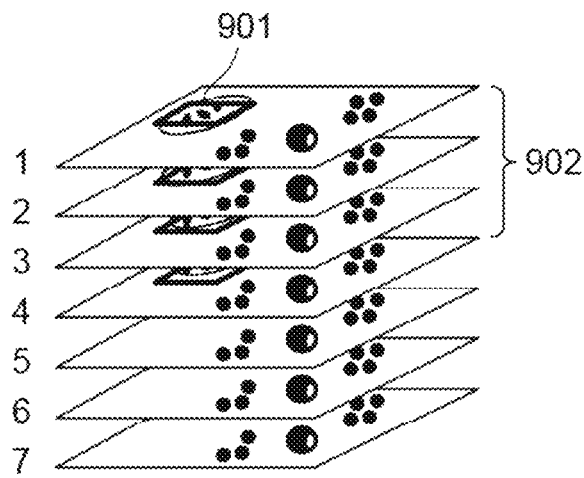
FIG. 9A shows an example in which the continuous section sample 105 is formed by cutting the same sample with different cut surfaces.

FIG. 9A shows an example in which the continuous section sample 105 is formed by cutting the same sample with different cut surfaces. It is assumed that sample sections have substantially the same shape pattern. However, depending on the structure of the sample, a shape and a structure of an observation target 901 may change for each cutting position, or the observation target 901 may be not present depending on the cutting position. The controller 100 displays an image of the medium magnification region 303 on the medium magnification region display unit 502, and the user specifies, on the screen, a range 902 including the desired observation target 901 while viewing the image. The controller captures the high magnification image only for the sample section that is provided in the range 902 specified by the user. Accordingly, time required for imaging at a high magnification, which takes time, can be minimized, and the throughput can be improved.

Figure 9B:
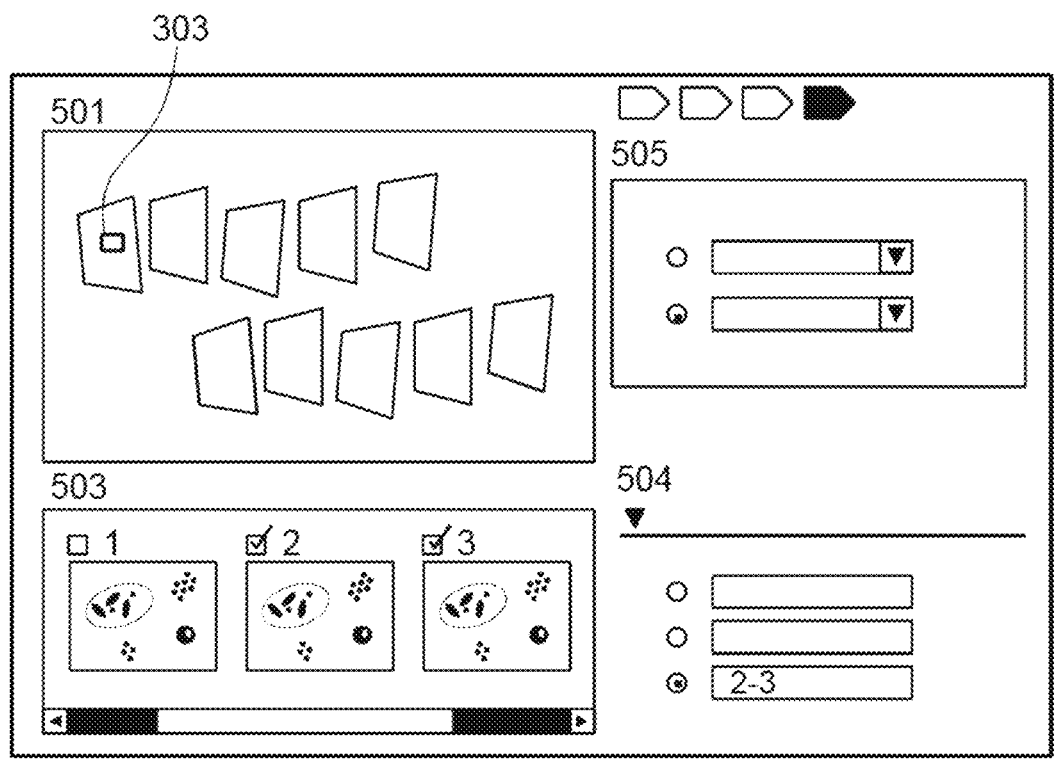
FIG. 9B shows an example of a method for a user to specify a range 902 on the screen interface.

FIG. 9B shows an example of a method for the user to specify the range 902 on the screen interface. It is considered that there are mainly two types of methods for specifying the section. One is a method of checking the number of the section specified by the user on the captured image display unit 503. The other is a method of inputting, with a numerical value, the number of the section specified by the user on a section specifying display unit 504.

Fifth Embodiment

Figure 10:
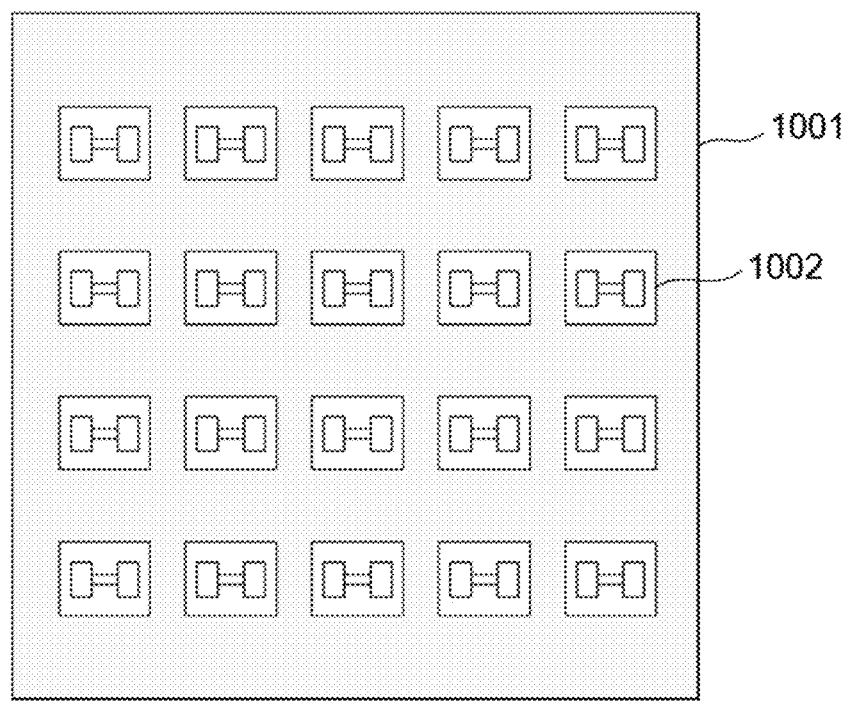
FIG. 10 shows another example of a sample that can be observed by the charged particle beam device 10.

FIG. 10 is another example of a sample that can be observed by the charged particle beam device 10. In the above embodiments, a biological tissue sample is exemplified as the continuous section sample 105. The invention is not limited to the section of the sample in which the resin is embedded, and can be applied to various samples. For example, as shown in FIG. 10, a sample in which patterns 1002 of a plurality of semi-conducting devices are arranged on a substrate 1001 can also be observed by the charged particle beam device 10. Specifically, the invention can be applied as long as shapes of the patterns 1002 are equivalent and a positional relationship among the patterns 1002 can be recognized by the position calculation unit 122. The invention can also be applied to the other samples as long as the sections are continuously arranged in the samples. For example, a soft metal that can be cut may be considered.

Sixth Embodiment

When the user views a position alignment result of the image of the medium magnification region 303 displayed on the medium magnification region display unit 502, the user may determine that position alignment accuracy is insufficient. The controller 100 displays an interface for inputting the magnification of the medium magnification region 303 on a setting screen 505 (FIG. 9B). When the accuracy of position alignment is insufficient, the user can increase the magnification of the medium magnification region 303 by one step on the setting screen 505. The position calculation unit 122 performs the position alignment again by executing S206 again using the image obtained by increasing the magnification by one step. The operation is repeated until the user or the controller 100 determines that the accuracy of the position alignment is sufficient.

In order to prevent repetition of the work performed by the user, the user can also input a plurality of magnifications of the medium magnification region 303 on the setting screen 505 in advance. In this case, the controller 100 performs position alignment by executing S206 sequentially using the magnification input in advance by the user.

Seventh Embodiment

The timing at which the position alignment of the section is performed is not limited to a timing at which all images in the medium magnification region 303 of the section are captured. For example, the position calculation unit 122 may perform position alignment when an image of the medium magnification region 303 of each of the first sample section and the second sample section is acquired. After the position alignment operation, the image acquisition unit 117 images the high magnification region of the second sample section. After the medium magnification region 303 of the third sample section is imaged, the position calculation unit 122 corrects the position of the third sample section based on the position information of the second sample section. After the position alignment, the image acquisition unit 117 images a high magnification region of the third sample section. This operation is similarly performed in the fourth section and subsequent sections, and the controller 100 sequentially performs the position correction and the high magnification imaging at the same time.

As described above, a procedure of acquiring the high magnification image after performing the position alignment between the two adjacent sample sections is set as one operation unit, and the operation unit is repeatedly performed while deviating the target sections one by one. Accordingly, it is not necessary to store the images of the medium magnification region 303 of all sections. Therefore, a size of the storage region for storing the image of the medium magnification region 303 can be reduced.

Modification of Invention

The invention is not limited to the embodiments described above, and includes various modifications. For example, the above-described embodiments have been described in detail for easy understanding of the invention, and are not necessarily limited to those having all the configurations described above. A part of the configuration according to one embodiment can be replaced with the configuration according to another embodiment, and the configuration according to one embodiment can be added to the configuration according to another embodiment. A part of the configuration according to each embodiment can be added, deleted, or replaced with another configuration.

In the above embodiment, the controller 100 and the functional units provided in the controller 100 can be hardware such as a circuit device that implements functions of the controller 100 and the functional units, or can be implemented by an arithmetic device executing software that implements the functions of the controller 100 and the functional units.

In the above embodiment, although the example has been described in which the charged particle beam device 10 is a scanning electron microscope, the invention can also be applied to other types of charged particle beam devices that acquire observation images of samples. The invention can also be applied to an imaging device other than the charged particle beam device, for example, a confocal laser scanning microscope.

REFERENCE SIGN LIST

10: charged particle beam device
100: controller
102: lens barrel
103: sample chamber
104: device main body
105: continuous section sample
106: electron beam
107: electron gun
108: electron optical system
109: condenser lens
110: deflector
111: objective lens
112: sample table
113: signal
114: detector
115: sample stage
116: stage control device
117: image acquisition unit
118: instruction input unit
119: position storage unit
120: image processing unit
121: correction image generation unit
122: position calculation unit
123: optical system control unit
124: stage control unit
125: display device

The invention claimed is:

1. An imaging device configured to capture an image of a sample including a plurality of sections, the imaging device comprising:
an imaging unit configured to generate an image signal indicating an image of the sample;
a controller configured to generate the image of the sample using the image signal; and
an interface configured to receive a first specified input specifying coordinates in the image, wherein
the controller generates, as images of the sample, a first image, a second image having a narrower range than the first image, and a third image having a higher resolution than the second image,
the interface receives the first specified input specifying, in the first image, coordinates of a first feature point of a first sample section, coordinates of a first observation region which is a partial region of the first sample section, and coordinates of a second feature point of a second sample section,
the controller identifies the coordinates of the second observation region corresponding to the first observation region on the second sample section according to a correspondence relationship between the first feature point and the first observation region,
the controller generates the second image of the first observation region and the second image of the second observation region, and corrects a deviation between the second image of the first observation region and the second image of the second observation region, and
after reflecting the deviation between the second image of the first observation region and the second image of the second observation region, the controller performs position alignment between the third image of the first sample section and the third image of the second sample section by generating the third image in the first observation region and generating the third image in the second observation region.

2. The imaging device according to claim 1, wherein
the controller corrects, as the deviation, a rotation deviation and a position deviation between the second image of the first observation region and the second image of the second observation region, and
the controller corrects, by correcting the rotation deviation and the position deviation, an angle difference and a positional difference between the first observation region and the second observation region that still remain after identifying the coordinates of the second observation region.

3. The imaging device according to claim 1 further comprising:
a stage configured to cause a position on the sample, from which the imaging unit acquires the image signal, to be scanned by placing and moving the sample, wherein
the controller adjusts the deviation between the second image of the first observation region and the second image of the second observation region by reflecting the deviation with respect to a position of the stage.

4. The imaging device according to claim 1, further comprising:
an irradiation unit configured to irradiate the sample with a charged particle beam;
a deflector configured to scan a position on the sample, from which the imaging unit acquires the image signal, by deflecting the charged particle beam; and
a detector configured to detect a secondary charged particle generated by the charged particle beam colliding with the sample, wherein
the imaging unit generates the image signal using the secondary charged particle detected by the detector, and
the controller adjusts the deviation between the second image of the first observation region and the second image of the second observation region by reflecting the deviation with respect to an amount of deflection performed by the deflector.

5. The imaging device according to claim 1, wherein
the interface receives a second specified input that specifies a plurality of target regions for which the third image is to be acquired in the second image, and
the controller generates the third image for each of the target regions specified by the second specified input.

6. The imaging device according to claim 1, wherein
the interface displays each second image generated by the controller for a respective one of the sections,
the interface receives a second specified input that specifies which of the sections the third image is to be acquired for by specifying any of the second images, and
the controller acquires the third image for the section specified by the second specified input, and skips processing of acquiring the third image for the section not specified by the second specified input.

7. The imaging device according to claim 6, wherein
the plurality of sections are formed as continuous samples in which similar sample pieces are continuous by cutting the same sample on different cut surfaces,
the interface receives, as the second specified input, a specified input that specifies the sample piece for which the third image is to be acquired in the continuous sample, and
the controller acquires the third image for the sample piece specified by the second specified input, and skips processing of acquiring the third image for the sample piece not specified by the second specified input.

8. The imaging device according to claim 1, wherein
the interface receives a second specified input that specifies a resolution of the second image, and
the controller generates the second image having the resolution specified by the second specified input.

9. The imaging device according to claim 8, wherein
the interface receives a specified input that specifies a plurality of resolutions of the second image as the second specified input before the controller generates the second image, and
the controller generates the second image having each of the resolutions specified by the second specified input.

10. The imaging device according to claim 1, wherein
the controller identifies coordinates of the third observation region corresponding to the first observation region on the third sample section, and
the controller corrects the deviation between the second image of the first observation region and the second image of the second observation region, and then corrects a deviation between the second image of the second observation region and the second image of the third observation region.

11. The imaging device according to claim 10, wherein
the controller generates the second image of the third observation region after generating the third image of the second sample section and before generating the third image of the third sample section.

12. The imaging device according to claim 1, further comprising:
an irradiation unit configured to irradiate the sample with a charged particle beam;
a deflector configured to scan a position on the sample, from which the imaging unit acquires the image signal, by deflecting the charged particle beam; and
a detector configured to detect a secondary charged particle generated by the charged particle beam colliding with the sample.

13. The imaging device according to claim 1, wherein
the controller generates an image of a section of a biological tissue as the plurality of sections.

14. The imaging device according to claim 1, wherein
the controller generates an image of a section of a material as the plurality of sections.

* * * * *